United States Patent
Tang

(10) Patent No.: US 6,680,257 B2
(45) Date of Patent: Jan. 20, 2004

(54) ALTERNATIVE RELATED TO SAS IN FLASH EEPROM

(75) Inventor: Yuan Tang, San Jose, CA (US)

(73) Assignee: EON Silicon Devices, Inc., Santa Clara, CA (US)

( * ) Notice: Subject to any disclaimer, the term of this patent is extended or adjusted under 35 U.S.C. 154(b) by 119 days.

(21) Appl. No.: 09/916,877

(22) Filed: Jul. 30, 2001

(65) Prior Publication Data
US 2003/0022500 A1 Jan. 30, 2003

(51) Int. Cl.$^7$ ............................................. H01L 21/302
(52) U.S. Cl. ...................... 438/706; 438/710; 438/712; 438/720
(58) Field of Search ................................. 438/264, 266, 438/521, 694, 691, 692, 706, 710, 712, 720

(56) References Cited

U.S. PATENT DOCUMENTS

| | | | |
|---|---|---|---|
| 5,482,881 A | * | 1/1996 | Chen et al. ................ 438/264 |
| 5,534,455 A | * | 7/1996 | Liu ........................... 438/264 |
| 5,674,767 A | * | 10/1997 | Lee et al. .................. 438/264 |
| 5,700,704 A | * | 12/1997 | Ikeda et al. ................. 438/96 |
| 5,736,442 A | * | 4/1998 | Mori ........................ 438/257 |
| 6,013,551 A | * | 1/2000 | Chen et al. ................ 438/264 |
| 6,030,869 A | * | 2/2000 | Odake et al. .............. 438/266 |
| 6,365,457 B1 | * | 4/2002 | Choi ......................... 438/264 |

FOREIGN PATENT DOCUMENTS

JP 09069578 A * 3/1997 ....... H01L/21/8247

* cited by examiner

*Primary Examiner*—Nadine G. Norton
*Assistant Examiner*—Lan Vinh
(74) *Attorney, Agent, or Firm*—Davis Chin

(57) ABSTRACT

A method of eliminating contamination of tunnel oxide in stacked gates due to SAS photoresist process and preventing of n+ implantation caused by resist residue from the SAS photoresist process in fabricating of semiconductor memory devices is disclosed. The process provides for providing stacked gates separated by trenches on the semiconductor memory device. Source and drain implants are performed on the semiconductor memory device before the SAS etch is accomplished. The trenches between the stacked gates are filled with oxide so as to cover the entire surface of the semiconductor memory device prior to applying a SAS photoresist mask. Then, a SAS photoresist mask is applied to a flat top surface of the semiconductor memory device. A SAS etch is performed on the semiconductor memory device so as to remove the oxide. By filling in the trenches with oxide prior to applying the SAS photoresist mask, the possibility of SAS photoresist contamination of the tunnel oxide in the stacked gate has been eliminated. Further, no SAS photoresist residue is left which can block a subsequent n+ doping.

7 Claims, 7 Drawing Sheets

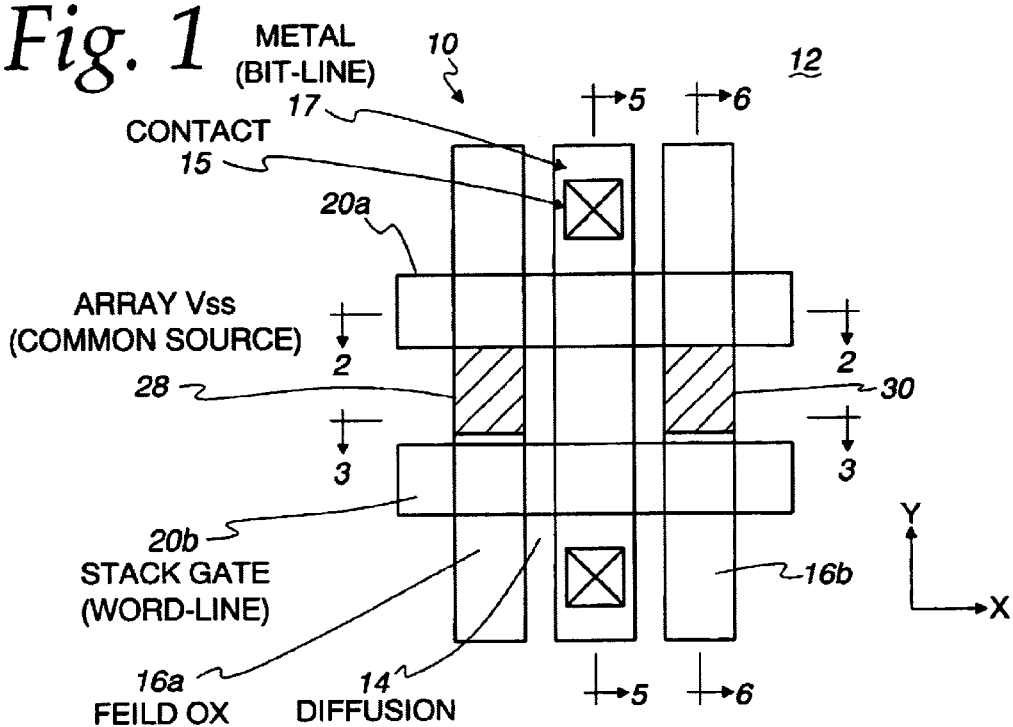
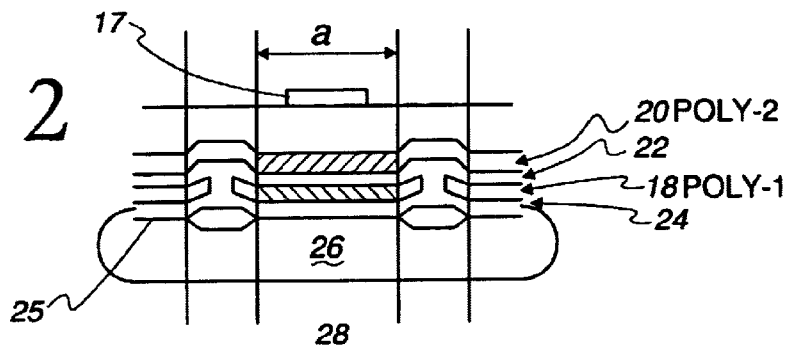
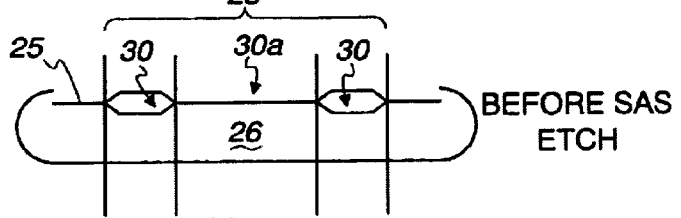
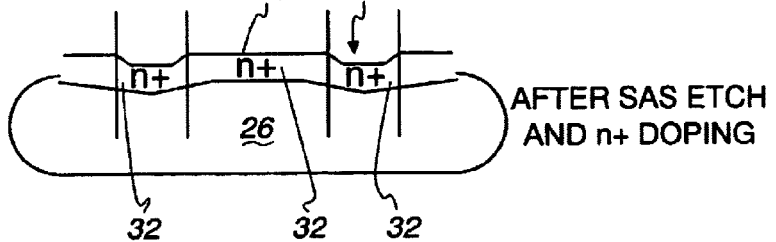

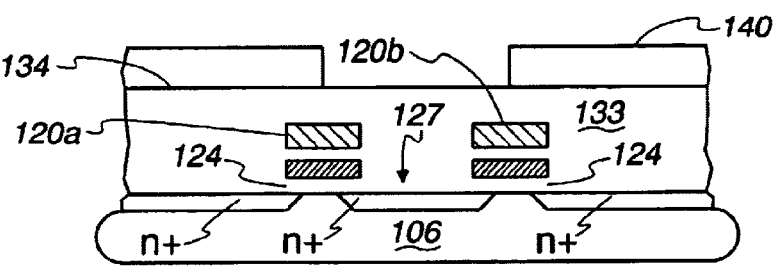
*Fig. 9b*
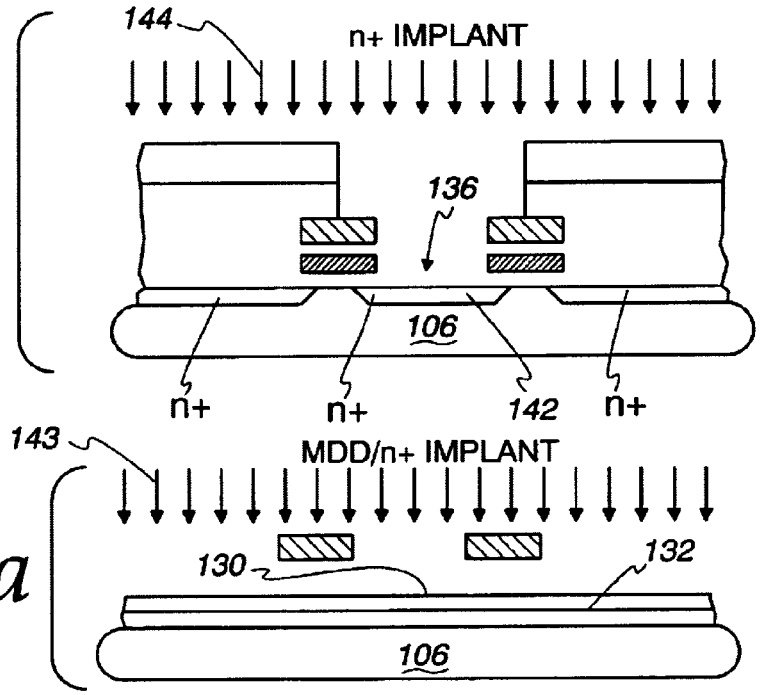
*Fig. 9c*
*Fig. 10a*
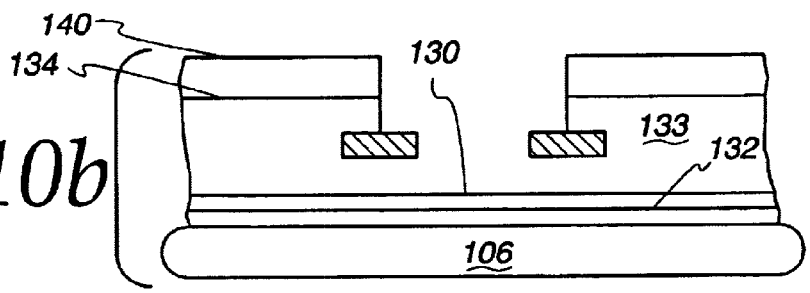
*Fig. 10b*
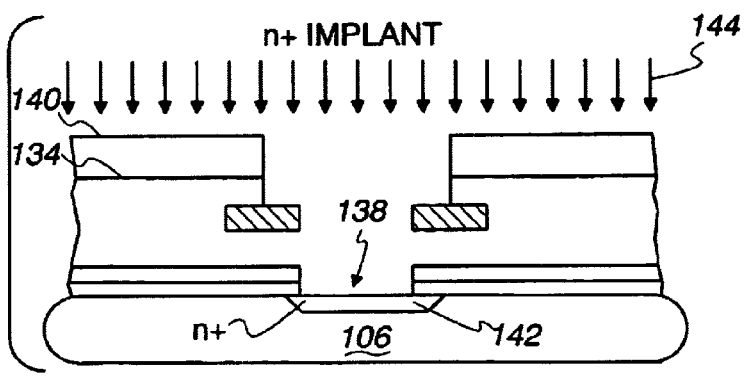
*Fig. 10c*

ALTERNATIVE RELATED TO SAS IN FLASH EEPROM

BACKGROUND OF THE INVENTION

1. Field of the Invention

This invention relates generally to processing methods for fabricating non-volatile semiconductor memory devices having a floating gate, such as EPROMs and Flash EEPROMS. More particularly, it relates to an improved method for eliminating problems associated with self-aligned source (SAS) photoresist process used in the fabrication of Flash EEPROMS.

2. Description of the Prior Art

As is generally well-known in the art, non-volatile memory devices using a floating gate for the storage of charges thereon such as EPROMs (erasable programmable read-only memories), EEPROMS (electrically, erasable programmable read-only memories) or Flash EEPROMS have emerged in recent years. In such a conventional Flash EEPROM memory device, a plurality of such one-transistor memory cell may be formed on a P-type semiconductor substrate in which each cell is comprised of an n+ drain region and an n+ source region both formed integrally within the substrate. A relatively thin gate dielectric layer is interposed between a top surface of the substrate and a conductive polysilicon floating gate. A polysilicon control gate is insulatively supported above the floating gate by a second dielectric layer. A channel region in the substrate separates the drain and source regions.

As is well known, Flash EEPROM devices have become very useful in forming many electrical and electronic products. In view of this trend, there has arisen a high demand on memory device manufacturers to develop Flash EEPROM devices with higher and higher densities so as to enhance their performance as well as to reduce their manufacturing cost. One of the typical ways of increasing the density of the memory devices has been accomplished through the use of a so-called self-aligned source (SAS) etching process.

An example of this SAS etching process is described and illustrated in U.S. Pat. No. 5,534,455 to David K. Y. Liu entitled "METHOD FOR PROTECTING A STACKED GATE EDGE IN A SEMICONDUCTOR DEVICE FROM SELF ALIGNED SOURCE (SAS) ETCH," which is hereby incorporated by reference in its entirety. This '455 patent discloses a process and system for protecting a stacked gate edge of a semiconductor device. The stacked gate edge is provided on the semiconductor device. A source implant is performed to ensure uniform profile prior to a self-aligned source (SAS) etch. Next, a polysilicon spacer is formed on the stacked gate edge prior to the SAS etch. Then, a SAS etch is performed on the semiconductor device. As a result, the tunnel oxide integrity has been improved and the source junction oxide integrity has been made more uniform since the silicon around the source region has not been gouged away or damaged.

However, the process sequence used in the '455 patent of the prior art is not concerned with solving the problems caused by the SAS photoresist process associated with the SAS etch. The process sequence used in this prior art can cause contamination of the tunnel oxide due to the SAS photoresist material contacting the edges of the stacked gates. Further, the removal and cleaning of the photoresist after it has been developed and resist strip from unwanted areas will be difficult to achieve and can leave resist residues. The resist residues will cause blocking of a subsequent implantation in the field oxide regions where it should have been removed.

Accordingly, there has arisen a need for providing an improved method for fabricating semiconductor memory devices which eliminates all of the negative impacts relative to the SAS photoresist process used in the Flash EEPROM process. It would also be expedient that the improved method be capable of being performed without the addition of any new process steps and require only minimal modifications to the existing process steps.

SUMMARY OF THE INVENTION

Accordingly, it is a general object of the present invention to provide an improved method for eliminating problems associated with the SAS photoresist process used in the fabrication of Flash EEPROM memory devices which overcomes the disadvantages of the prior art.

It is an object of the present invention to provide an improved method for fabricating semiconductor memory devices which eliminates all of the negative impacts relative to the SAS photoresist process used in the Flash EEPROM process.

It is another object of the present invention to provide an improved method for fabricating semiconductor memory devices which can be performed with only minimal modifications to existing process steps.

It is still another object of the present invention to provide an improved method for fabricating a semiconductor memory device which eliminates contamination of the tunnel oxide by the SAS photoresist process and prevents blocking of implantation due to the resist residue from the SAS process.

In a preferred embodiment of the present invention, there is provided a method of eliminating contamination of tunnel oxide in stacked gates due to SAS photoresist process and preventing of n+ implantation caused by resist residue from the SAS photoresist process in fabricating of a semiconductor memory device. Stacked gates are provided on the semiconductor memory device which are separated by trenches. Source and drain implants are performed on the semiconductor memory device. The trenches between the stacked gates are filled with oxide so as to cover the entire surface of the semiconductor memory device. The entire surface of the semiconductor memory device is planarized so as to provide a flat top surface. A SAS photoresist mask is applied to the flat top surface of the semiconductor memory device. A SAS etch is performed on the semiconductor memory device so as to remove the oxide. A source connection implant is performed so as to provide a common source line.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a top plan view, showing the layout of a conventional Flash EEPROM memory cell array;

FIG. 2 is a vertical cross-sectional view, taken along the lines 2—2 of FIG. 1;

FIG. 3 is a vertical cross-sectional view before the SAS etch, taken along the lines 3—3 of FIG. 1;

FIG. 4 is a vertical cross-sectional view after the SAS etch and n+ doping, taken along the lines 3—3 of FIG. 1;

FIGS. 9(a) through 9(c) are horizontal cross-sectional view taken along the lines 5—5 of FIG. 1 and arranged in manufacturing steps order, useful in explaining the technique in accordance with the present invention; and FIGS. 10(a) through 10(c) are horizontal cross-sectional views, taken along the lines 6—6 of FIG. 1 and arranged in manufacturing step order, useful in explaining the technique in accordance with the present invention.

DESCRIPTION OF THE PREFERRED EMBODIMENT

Before describing in detail the improved method of the present invention for fabricating semiconductor memory devices which eliminates all of the negative impacts relative to the SAS photoresist process, it is believed that it would be helpful in understanding the principles of the instant invention and to serve as a background by explaining initially the fabrication steps for forming memory cells in a semiconductor substrate in accordance with a conventional EEPROM fabrication technique with reference to FIG. 1 through FIGS. 8(a)–8(j). Thus, the conventional EEPROM fabrication process employed for forming memory devices will now be described hereinbelow as well as the problems associated therewith.

In FIG. 1, there is shown a top plan view of a portion 10 of a flash EEPROM memory cell array 12 formed in accordance with a conventional EEPROM fabrication process. FIGS. 2 through 6 are various vertical and horizontal cross-sectional views of FIG. 1. As can be seen from FIG. 1, the layout of the memory cell array portion 10 is duplicated from left-to-right in a horizontal direction, as indicated by arrow X and from top-to-bottom in a vertical direction, as indicated by arrow Y. A diffusion stripe 14 extends in a vertical direction and is formed between parallel rows of field oxide (FOX) isolation stripes 16a, 16b. The width dimension "a" (along the X direction) of the diffusion stripe 14 defines the channel width of a memory cell.

Figure 5:
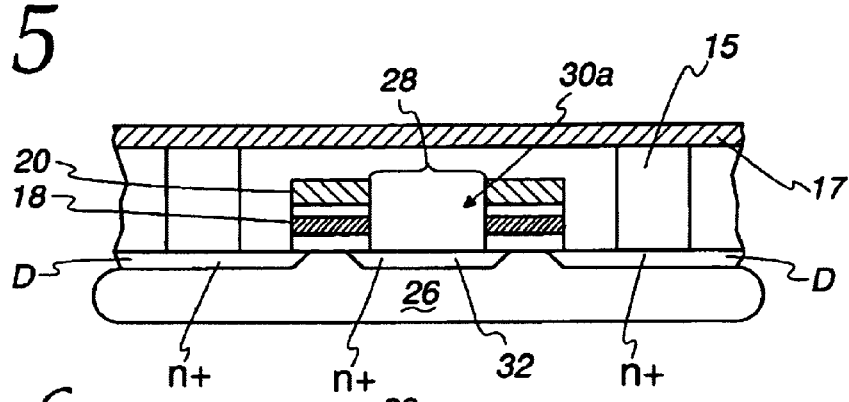
FIG. 5 is a horizontal cross-sectional view, taken along the lines 5—5 of FIG. 1.

As can best be seen from FIGS. 2 and 5, the memory cell is formed basically of an N-channel MOSFET device having a floating gate or poly-1 layer 18 disposed beneath a control gate or poly-2 layer 20. An interdielectric layer 22 is used to separate the control gate 20 from the floating gate 18. The interdielectric layer 22 may be preferably formed of an oxide-nitride-oxide (ONO) layer. A tunneling oxide layer 24 is used to separate the floating gate layer 20 from a silicon substrate 26. This combination of the two gates (floating gate and control gate) is sometimes referred to as a stacked gate structure. The drains D of all of the memory cells in a particular column are connected through a contact connection 15 to a metal line 17 running from top-to-bottom.

The control gate layer 20 is defined by poly word-lines 20a and 20b (FIG. 1) which extend in parallel in the X direction to a common source line 28. The common source line 28 is connected to all of the memory cells in the memory array which is called also Array VSS line. Each of the poly word-lines 20a, 20b is defined by a stripe of the poly-2 layer 20 which extends from left-to-right in the X direction across all of the memory cells in a particular row. The width of the poly-2 layer 20 in the Y direction defines the gate length of the memory cell.

Figure 6:
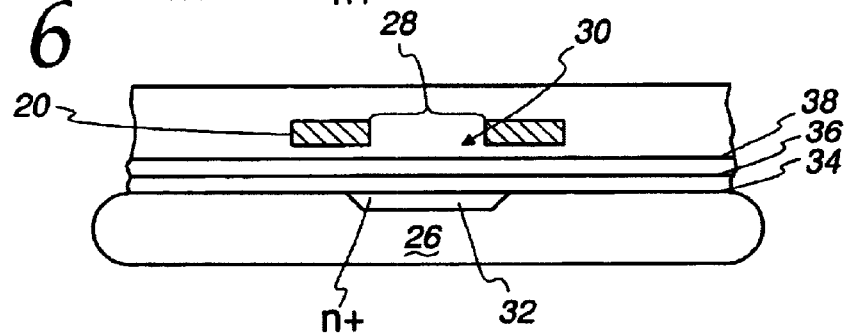
FIG. 6 is a horizontal cross-sectional view, taken along the lines 6—6 of FIG. 1.

The field oxide isolation stripes 16a, 16b are formed of silicon dioxide ($SiO_2$) which are grown above and below the surface 25 of the silicon substrate 26, as shown in the respective cross-sectional views of FIGS. 2 and 3. It will be noted that the cross-sectional view of FIG. 3 is taken in the X-direction across the common source line (Array VSS line or hallway) 28 consisting of areas 30 and 30a extending between the two poly word-lines 20a, 20b (stacked-gate). The double cross-hatched areas 30 represent the regions where the field oxide (FOX) have been grown. The area 30a represents the area above a common source region where no field oxide exist. Since the Array VSS line or hallway 28 is used to provide the common source line of all of the memory cells in the array 12, the entire Array VSS line or hallway 28 is required to receive an n+ doping 32 so as to form a conductive stripe along the X-direction. This is shown in FIGS. 4 and 6. However, the field oxide regions 30 (FIG. 3) will be blocking or preventing the n+ implant 32 due to the thickness of the field oxide. Thus, these field oxide regions must be etched away in order to allow for the implantation to be performed.

This field oxide etch step in the Flash EEPROM process is called a self-aligned source (SAS) etch. Referring now to FIG. 4, after the SAS etching it can be seen that the surface of the silicon substrate in the field oxide region 30 is somewhat lower than the surface 25 of the silicon substrate 26 in the diffusion area 14 since the oxide had been grown into the silicon substrate. In FIG. 6, there is shown a vertical cross-sectional view taken in the Y-direction across the field oxide layer 16b. It will be noted that the n+ doping 32 has been performed after the SAS etching and the field oxide is denoted by lines 34, 36 and 38. The bottom line 34 corresponds to the depth of the field oxide lying below the surface of the silicon substrate. The middle line 36 corresponds to the surface of the silicon substrate below the field oxide grown thereon. The top line 38 corresponds to the height of the field oxide extending above the surface of the silicon substrate. It will be further noted that in FIG. 6 the field oxide region 30 has been etched below the surface 36 of the silicon substrate and the n+ doping 32 has been subsequently implanted into the substrate. In this manner, the entire Array VSS hallway 28 can then be connected through the n+ doping 32.

Each set of FIGS. 7(a) through 7(j) and FIGS. 8(a) through 8(j) show a series of manufacturing steps which are useful in explaining the prior art technique for fabricating the memory array 10 of FIGS. 1 through 6. The FIGS. 7(a)–7(j) are horizontal cross-sectional views taken along the lines 5—5 of FIG. 1 (along the diffusion strips 14 in the X direction). FIGS. 8(a)–8(j) are horizontal cross-sectional views taken along the lines 6—6 of FIG. 1 (along the field oxide stripe 16b in the X direction).

Figure 7A:
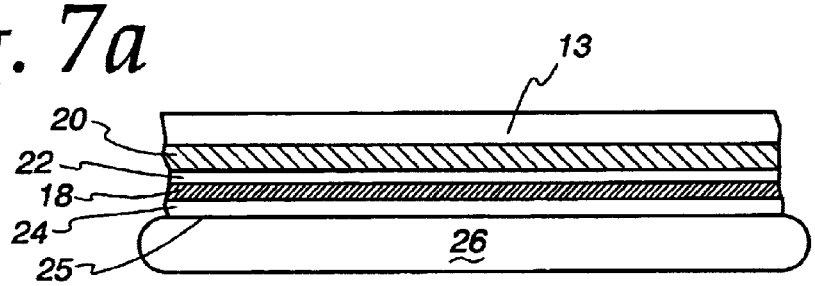
FIGS. 7(a) through 7(j) are horizontal cross-sectional views taken along the lines 5—5 of FIG. 1 and arranged in manufacturing step order, useful in explaining the prior art technique for fabricating the memory array in FIG. 1.
Figure 8A:
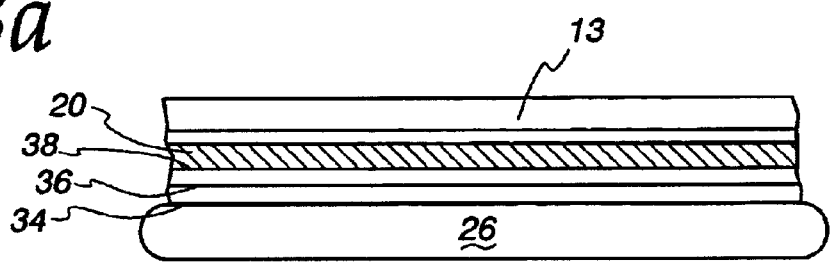
FIGS. 8(a) through 8(j) are horizontal cross-sectional views taken along the lines 6—6 of FIG. 1 and arranged in manufacturing step order, useful in explaining the prior art technique for fabricating the memory array in FIG. 1.

As shown in FIGS. 7(a) and 8(a), the tunnel oxide layer 24 is formed on the top surface 25 of a P-type silicon substrate 26 in the diffusion stripe 14. A poly-1 layer 18 is formed along the Y-direction so as to cover the tunnel oxide layer 24. On top of the poly-1 layer 18 there is deposited the interdielectric layer 22 (ONO layer). The poly-2 layer 20 is then formed over the entire surface of the memory array. Thereafter, on top of the poly-2 layer 20 there is provided a photoresist layer 13 which is used for a stack gate etch. It will be noted that in FIG. 8(a) the lines 34, 36 and 38 correspond to the ones depicted in FIG. 6 so as to emphasize that the field oxide has been grown below the surface 36 of the silicon substrate. As can be seen in FIG. 8(a), only the poly-2 layer 20 appears since the poly-1 layer 18 has been cut along the Y-direction in the field oxide region 30 (FIG. 2).

Figure 7B:
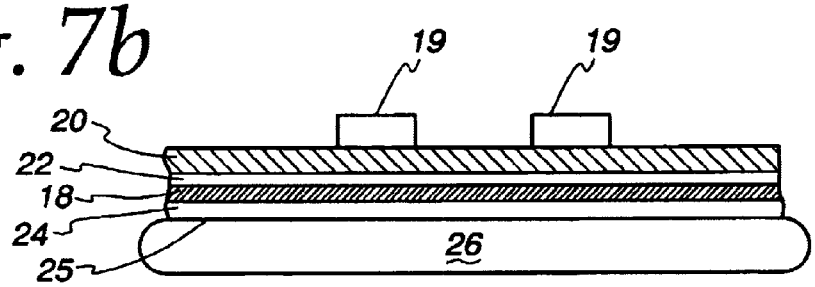
Figure 7C:
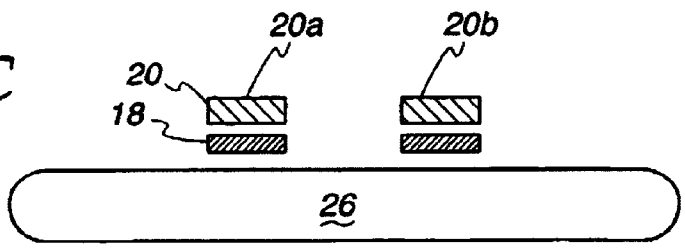
Figure 8B:
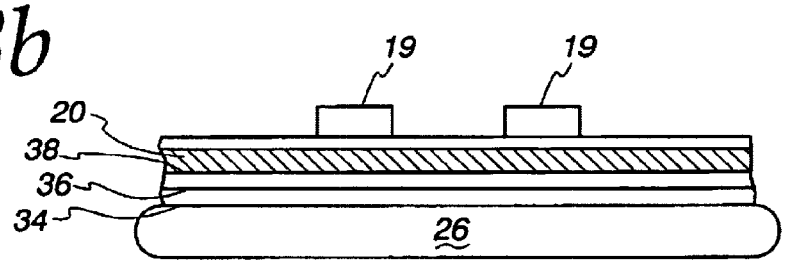
Figure 8C:
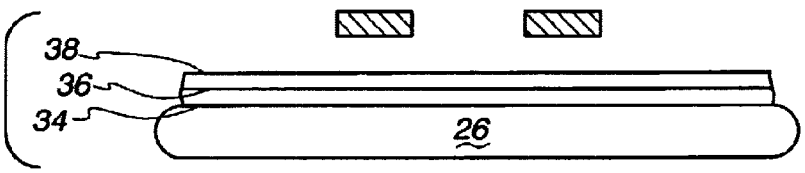

In FIGS. 7(b) and 8(b), the photoresist layer 13 has been developed in accordance with a stack gate etch (SGE) mask 19 which are stripes aligned with reference to the pattern of the stacked gate structure. In FIGS. 7(c) and 8(c), the poly-2 layer 20, ONO layer 22, poly-1 layer 18 and the tunnel oxide layer 24 are selectively etched in succession by an anisotropic etching method using the SGE mask 19 so as to form the stacked gate regions (word-lines) 20a, 20b. Between the two regions of the word-lines, there is located the area where the common source line or Array VSS line is to be formed.

Figure 7D:
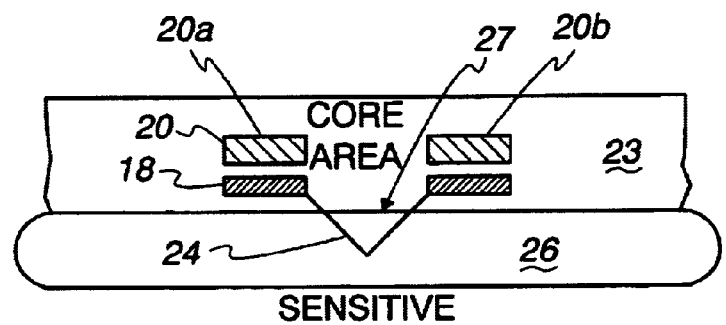
Figure 7E:
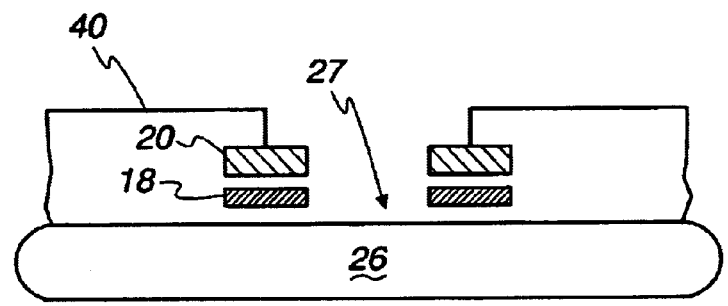
Figure 7F:
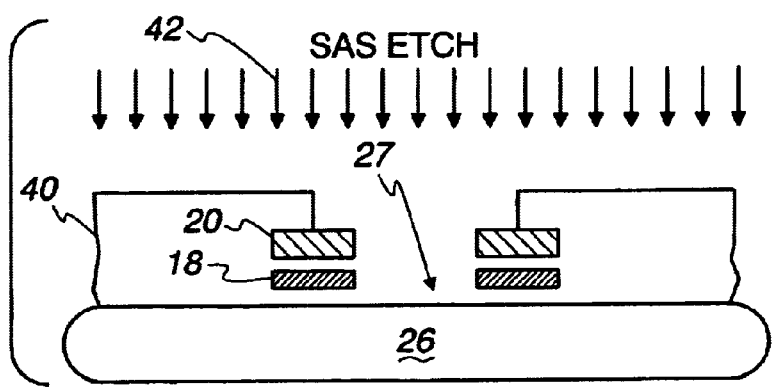
Figure 7G:
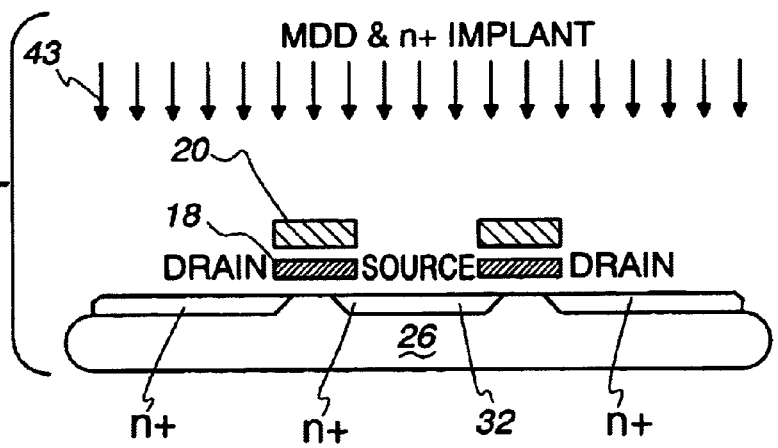
Figure 8D:
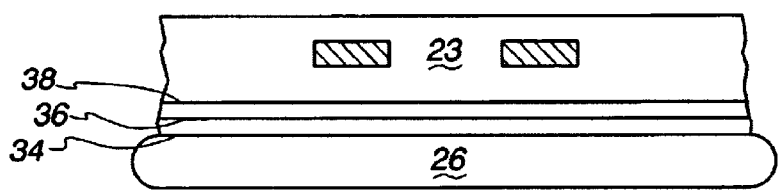

In FIGS. 7(d) through 7(g) and FIGS. 8(d) through 8(g) there are shown the continued manufacturing steps used in the prior art technique for removing the field oxide from the Array VSS line and for doping the exposed area with n+ implantation. As can be seen in FIGS. 7(d) and 8(d), a SAS photoresist layer 23 is applied to the entire surface of the memory array structure. It will be appreciated by those skilled in the art that topology of the structure is not flat but has defined features (stacked gate regions 20a, 20b) prior to the application of the SAS photoresist layer 23. As a consequence, in the core area where the memory cell transistors are to be formed, the photoresist material will fill within the narrow trenches 27 formed between the word-lines 20a, 20b. This photoresist material is typically a polymer which will come in contact engagement with the tunnel oxide layer 24 (highly sensitive) so as to adversely affect its integrity.

Figure 8E:
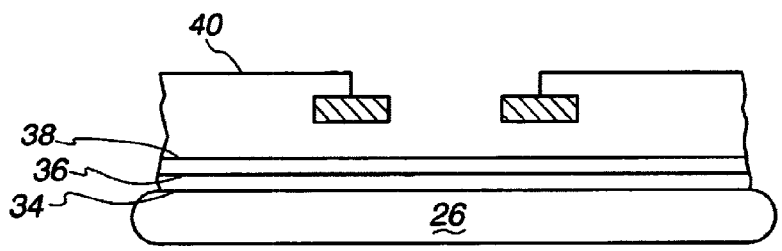

In FIGS. 7(e) and 8(e), the photoresist layer 23 is developed in accordance with a SAS photoresist mask 40. The patterns of the photoresist layer are stripes lying in the X direction. It should be clearly understood by those skilled in the art that the removal of the photoresist, which can be accomplished by plasma oxygen ashing and careful wet cleans, from the trenches 27 is a very difficult, uncertain and time-consuming task.

Figure 8F:
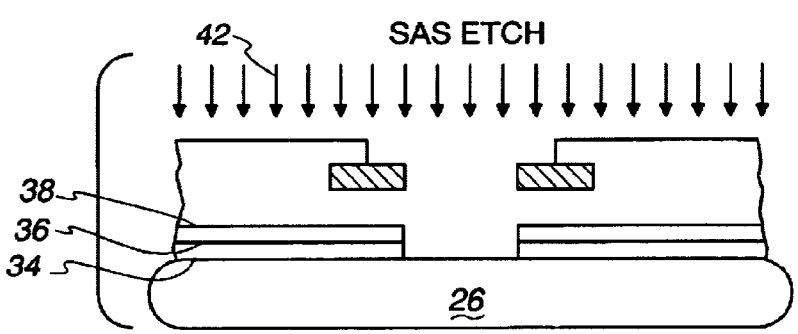

Next, in FIGS. 7(f) and 8(f), a SAS etch, as designated by arrows 42, is performed so as to allow for removal of the certain portions of the photoresist and oxide not covered by the SAS mask 40. It will be noted that the field oxide (FIG. 8(f)) is etched all the way down to below the surface 36 of the silicon substrate where growth of the field oxide is stopped. It will also be noted that the silicon is exposed from the beginning of the SAS etch in FIG. 7(f). Therefore, this SAS etch may affect the integrity of the tunnel oxide layer 24 as well as cause gouging of the silicon substrate which will cause variations in the regions where the source and drain implants are to be performed subsequently.

Figure 8G:
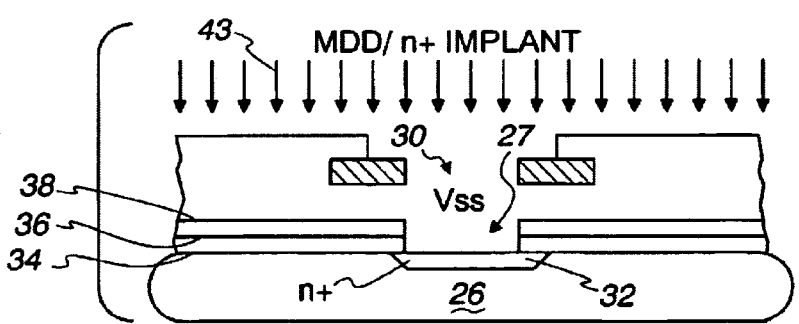

In FIGS. 7(g) and 8(g), after the SAS mask is removed, the source and drain implants as well as the n+ implantation, as designated by arrows 43, are performed by using n-type dopants, such as arsenic or phosphorus. In view of the fact that the field oxide has been etched away in the region 30 (FIG. 8(g)), the top surface 36 of the silicon substrate is exposed and can receive the n+ doping 32. In this manner, the n+ doping of FIG. 8(g) can be connected to the n+ doping of FIG. 7(g) in order to form a conductive stripe or a source connection implant defining the Array VSS line 28 (a common source line) extending along the X direction.

Figure 7H:
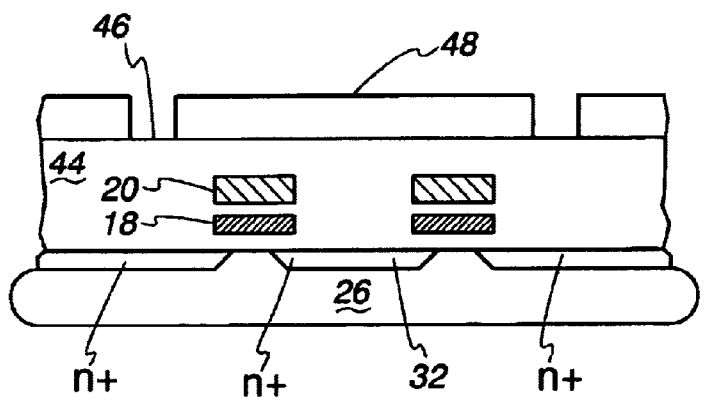
Figure 7I:
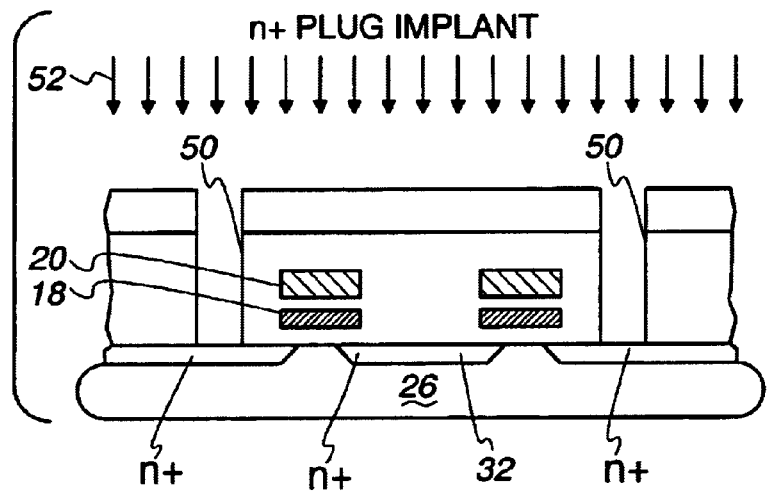
Figure 7J:
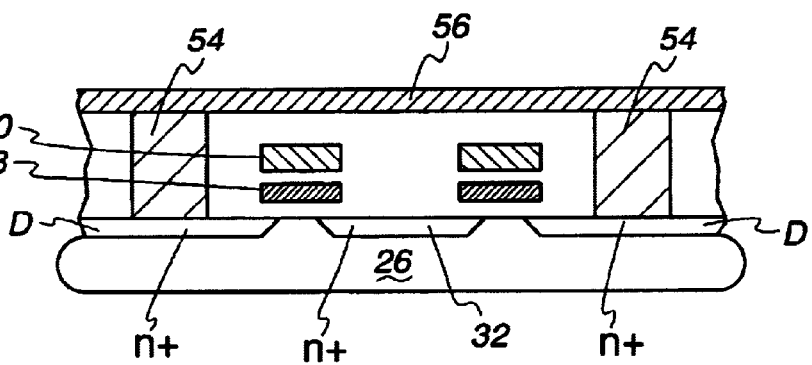
Figure 8H:
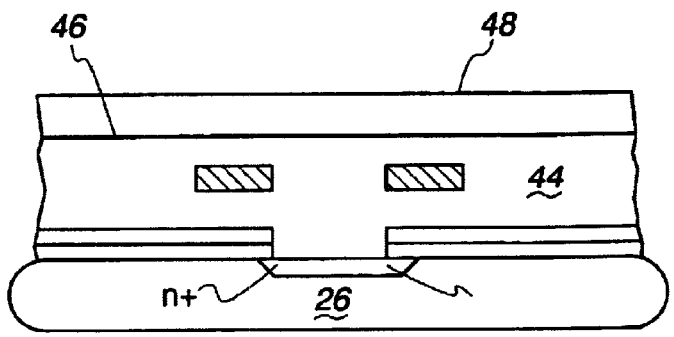
Figure 8I:
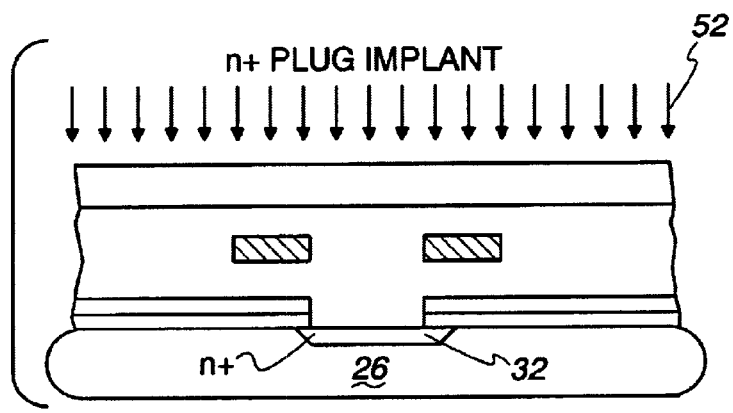
Figure 8J:
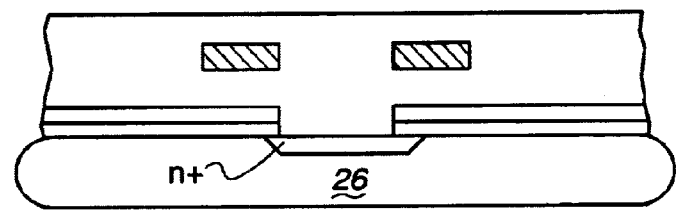

After the n+ doping is performed, all of the memory core transistors are completely finished. Then, a blanket layer 44 of oxide is deposited over the entire structure. Next, a chemical-mechanical polishing (CMP) process is performed so as to planarize the oxide layer so as to form a flat surface 46 followed by application of a contact mask 48. This is illustrated in FIGS. 7(h) and 8(h). Next, in FIGS. 7(i) and 8(i), drain contact holes 50 are formed through the contact mask by removing portions of the oxide followed by an n+ plug implantation which is designated by arrows 52. Finally, in FIGS. 7(j) and 8(j), the drain contact holes 50 are filled with tungsten plugs 54. Thereafter, a metal contact layer 56 is deposited and etched so as to provide a connection of all of the drain regions in a particular column. It will be noted that FIGS. 7(j) and 8(j) correspond to respective FIGS. 5 and 6.

The purpose of the present invention is to eliminate all of the problems caused by the SAS photoresist process of FIGS. 7(d) and 8(d) used in the prior art technique in fabricating the Flash EEPROM memory device. In particular, due to the unsmooth surface the application of the SAS photoresist material will lead to contamination of the tunnel oxide 24. Further, the resist residue of the photoresist material in the trenches 27 will prevent or block the required subsequent n+ doping 32 in the field oxide region 30.

Figure 9A:
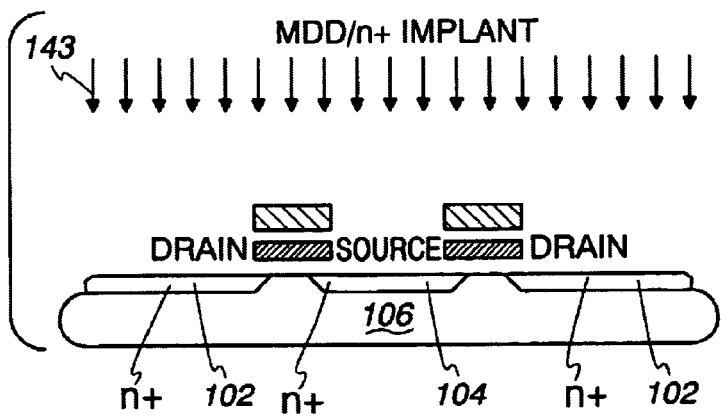

Since all of the manufacturing steps of the present invention up to and including FIGS. 7(c) and 8(c) for forming the poly word-lines with the Array VSS line disposed therebetween are identical to the prior art technique, the description of FIGS. 7(a)–7(c) and 8(a)–8(c) will not now be repeated. Thus, the manufacturing steps of the present invention will be described with reference to FIGS. 9(a)–9(c) and 10(a)–10(c) which begins at the same point in the prior art process of FIGS. 7(d) and 8(d). FIGS. 9(a)–9(c) are horizontal cross-sectional views taken along the lines 5—5 of FIG. 1. FIGS. 10(a)–10(c) are horizontal cross-sectional views taken along the lines 6—6 of FIG. 1. In other words, the present manufacturing steps illustrated in FIGS. 9 and 10 are used to replace the prior art manufacturing steps shown in FIGS. 7(d)–7(g) and FIGS. 8(d)–8(g). It should also be noted that the concluding processing steps in the prior art, namely FIGS. 7(h)–7(j) and 8(h)–8(j) used to create the metal contact layer for the drain connections are identical to those used in the present invention and thus will not be described again.

Referring initially to FIGS. 9(a) and 10(a), a modified drain diffusion (MDD) for creating the n+ source region 104 and n+ drain region 102, designated by arrows 143, are formed completely in the silicon substrate 106. It will be noted that no n+ doping is formed in the field oxide region 130 in view of the fact that the field oxide (FOX) in that area has been covered by the top surface 132 of the silicon substrate. The source and drain implants 104, 102 can be created by using either arsenic or phosphorus ions as the dopant which are implanted at a dose between $3\times10^{15}$ and $5\times10^{15}$ ions/cm$^2$ and at an energy between 30 and 60 KeV.

In FIGS. 9(b) and 10(b), a blanket oxide 133 is deposited over the entire structure and is then planarized to produce a flat surface 134. Thereafter, a SAS mask 140 is applied on top of the flat surface 134. Unlike the prior art technique in FIGS. 7(d), 7(e), 8(d), and 8(e), the trench areas 127 between the stacked gates are filled with oxide rather than with a photoresist material. As a result, a photoresist material of the SAS mask 140 will be unable to reach and contaminate the tunnel oxide 124 lying underneath the stacked gates 120a, 120b. Further, since the photoresist material is applied to the flat surface 134, the cleaning process for the photoresist after its development and the resist strip from unwanted areas will be much easier and guaranteed. Therefore, there has been eliminated the chance of leaving resist residues being trapped at the bottom of the field oxide region 130 which will block the subsequent implantation to be performed into that area.

As can be seen from FIGS. 9(c) and 10(c), the silicon is exposed in the areas 136 and 138 respectively after a SAS etching. As a consequence, n+ doping region 142 can be implanted, as indicated by arrows 144, into the area 138 where the field oxide existed prior to the SAS etching. It will be noted that the area 136, which is already implanted with the source region 104, will receive a second n+ implantation 142. However, there should be no difference in the device performance by this additional doping. By performing the n+ implantation twice into the source region 104 and once into the drain region 102, the present method actually provides a way of forming asymmetric junctions for a core cell. It should be appreciated by those skilled in the art that the provision of asymmetric junctions may be sometimes used for optimizing the performance of the core cell. After this, all of the remaining process steps are again identical to the prior art technique as shown in FIGS. 7(h)–7(j) and 8(h)–8(j) for making the contact connections to the drains.

In view of the foregoing detailed description, it can thus be seen that the present invention provides an improved method for fabricating semiconductor memory devices by performing n+ source and n+ drain implants followed by a blanket deposit oxide over the entire surface prior to the SAS mask and SAS etching. As a result, there has been eliminated the possibility of SAS photoresist contamination of the tunnel oxide in the stacked gate structures. In addition, there will be no SAS photoresist residue left which can block the subsequent n+ doping as well as preventing of gouging of the stacked gate edge. In comparison with the existing process in use, the improved method is capable of being performed without the need for any additional new mask.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A method of eliminating contamination of tunnel oxide in stacked gates due to SAS photoresist process and preventing of n+ implantation caused by resist residue from the SAS photoresist process in fabricating of semiconductor memory devices, comprising the steps of:

providing stacked gates separated by trenches in a vertical direction and overlying a silicon substrate on the semiconductor memory device;

providing a field oxide region on each side of the stacked gates in a horizontal direction overlying the silicon substrate on the semiconductor memory device;

performing source and drain implants on the semiconductor device;

filling in the trenches between the stacked gates with a blanket oxide so as to cover the entire surface overlying the silicon substrate of the semiconductor memory device in order to prevent contamination of the stacked gates;

planarizing the blanket oxide filling the entire surface overlying the silicon substrate of the semiconductor memory device to produce a flat top surface;

applying and developing a SAS photoresist mask to the flat surface of the blanket oxide of the semiconductor device so as to create an opening between the stacked gates in the horizontal direction overlying areas of the source implant and the field oxide region with the drain side being covered;

performing a SAS etch in the opening between the stacked gates in the horizontal direction overlying the areas of the source implant and the field oxide region on the semiconductor memory device so as to remove the blanket oxide in the areas overlying the source implant and the field oxide region and to remove the field oxide region overlying the silicon substrate so as to expose the same; and performing a source connection implant into the source implant only so as to provide a common source line along the horizontal direction from the area overlying the source implant to an area where the field oxide was removed to expose the silicon substrate.

2. A method of eliminating contamination as claimed in claim 1, wherein said source and drain implants are performed by using arsenic ions.

3. A method of eliminating contamination as claimed in claim 2, wherein said arsenic ions are implanted at a dose between $3\times10^{15}$ and $5\times10^{15}$ ions/cm$^2$.

4. A method of eliminating contamination as claimed in claim 3, wherein said arsenic ions are implanted at an energy between 30 and 60 KeV.

5. A method of eliminating contamination as claimed in claim 1, wherein said source and drain implants are performed by using phosphorus ions.

6. A method of eliminating contamination as claimed in claim 5, wherein said phosphorus ions are implanted at a dose between $3\times10^{15}$ and $5\times10^{15}$ ions/cm$^2$.

7. A method of eliminating contamination as claimed in claim 6, wherein said phosphorus ions are implanted at an energy between 30 and 60 KeV.

* * * * *